United States Patent [19]

Raiteri

[11] Patent Number: 4,596,067

[45] Date of Patent: Jun. 24, 1986

[54] DRILLING MACHINE FOR BOARDS, PARTICULARLY OF PRINTED CIRCUITS

[75] Inventor: Angelo Raiteri, Ivrea, Italy

[73] Assignee: PRT Pluritec Italia S.p.A., Burolo d'Ivrea, Italy

[21] Appl. No.: 575,830

[22] Filed: Feb. 1, 1984

[30] Foreign Application Priority Data

Feb. 17, 1983 [IT] Italy ............................... 67181 A/83

[51] Int. Cl.⁴ ...................... B23Q 3/157; B23B 39/24
[52] U.S. Cl. ........................................ 29/568; 408/3; 408/13; 408/15; 408/16; 408/43; 408/46
[58] Field of Search ............... 29/829, 568; 408/1 R, 408/3, 6, 13, 15, 16, 34, 43, 46, 51, 67, 68, 95, 98; 82/32; 308/3 R, 3 A

[56] References Cited

U.S. PATENT DOCUMENTS

| | | | |
|---|---|---|---|
| 2,859,643 | 11/1958 | McIver | 82/32 X |
| 3,030,744 | 4/1962 | Mueller | 308/3 A X |
| 3,171,327 | 3/1965 | Williamson | 408/3 X |
| 3,663,114 | 5/1972 | Welsh et al. | 408/3 |
| 3,783,741 | 1/1974 | Schadebrodt et al. | 408/3 X |
| 4,000,954 | 1/1977 | Patel | 408/3 |
| 4,043,700 | 8/1977 | Singer | 408/3 X |
| 4,185,376 | 1/1980 | Johnstone | 408/6 X |
| 4,280,775 | 7/1981 | Wood | 408/3 |
| 4,326,824 | 4/1982 | Lasermann et al. | 408/13 X |
| 4,397,074 | 8/1983 | Thornton et al. | 408/3 X |

FOREIGN PATENT DOCUMENTS

| | | | |
|---|---|---|---|
| 2041591 | 2/1972 | Fed. Rep. of Germany | 408/3 |
| 62706 | 5/1981 | Japan | 408/3 |

*Primary Examiner*—Gil Weidenfeld
*Assistant Examiner*—Steven C. Bishop
*Attorney, Agent, or Firm*—W. R. Hulbert

[57] ABSTRACT

The drilling machine comprises a pair of cross slides formed of two parallelepiped blocks of granite connected as a T above a horizontally stationary board carrying table. The transverse block carries two operating heads and, by means of pneumostatic bearings, guides their movement along the X-axis. The other block is guided by the machine frame by means of other pneumostatic bearings. Each head carries a spindle operable to lock and unlock the tool to permit automatic tool replacement from a corresponding tool magazine with provision for checking the integrity of the engaged tool. One of the heads can be disengaged from the X-axis servomotor and connected to the other one at a predetermined distance. Two series of equal printed circuit supports can be drilled simultaneously by using a single package of boards to be cut after the drilling or the etching. Tool changing and tool integrity checking operations can be effected simultaneously for the two operating heads.

8 Claims, 8 Drawing Figures

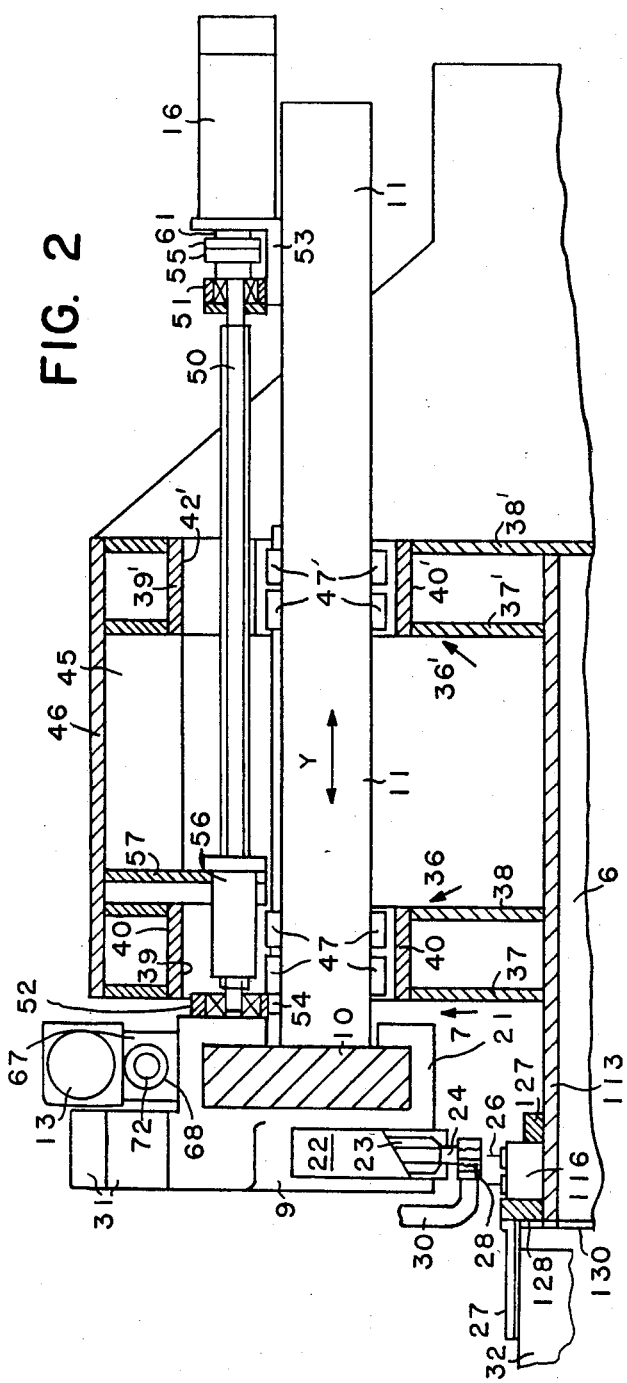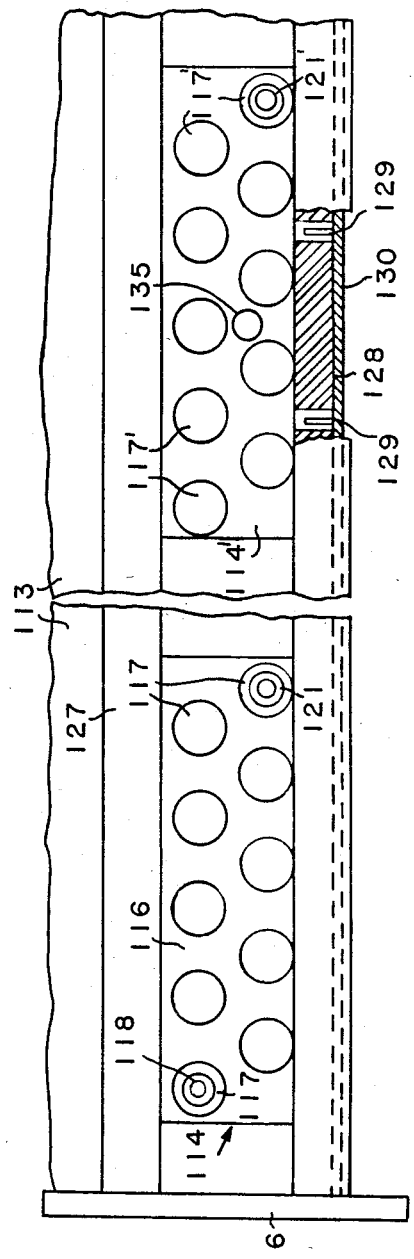

DRILLING MACHINE FOR BOARDS, PARTICULARLY OF PRINTED CIRCUITS

BACKGROUND OF THE INVENTION

The present invention relates to a drilling machine for boards, particularly of printed circuits, comprising at least one drilling head, a board carrying table, and displacing means for relatively displacing said table and said head along two coordinate axes.

Several drilling machines of the above said type are known. In them the table is normally mounted on a pair of slides, whereas the drilling head or the heads are mounted on the machine frame in a fixed position. These drilling machines, at each cycle are able to drill a package of a few boards predisposed between two dummy boards and mutually secured through reference pins for loading them in a predetermined position on the table. The boards are provided each one for a single printed circuit, whereby in case of a multiple drilling machine, each head can drill a corresponding package of boards to be individually mounted on the table.

In the known drilling machines the package loading and unloading operation is normally long and difficult in the structure with stationary heads, where the space is limited by the heads and the table, whereby the drilling is costly.

SUMMARY OF THE INVENTION

The technical problem that the invention intends to solve consists in providing a drilling machine having the greatest operative flexibility and reliability, and wherein the working cycle can be considerably reduced.

This technical problem is solved by the drilling machine according to the invention, which is characterized in that said table is stationary along said axes, and said head is carried by a pair of cross slides for being displaced to any drilling position with respect to said table.

According to another characteristic of the invention the head is movable on a transverse bar parallel to one of said axes and secured as a T to a prismatic bar parallel to the other axis, said transverse bar being movable on the machine frame, said transverse and said longitudinal bars being formed of two granite blocks with a rectangular section, rigidly mutually connected and cooperating with two air bearing systems associated with said head and with the frame.

These and other characteristics of the invention will become more clear from the following description of a preferred embodiment, made by way of example, but not in a limiting sense.

BRIEF DESCRIPTION OF THE DRAWINGS

FIG. 2 is a section taken according to the line II—II of FIG. 1;

FIG. 7 is a view of a detail of FIG. 3, in an enlarged scale;

DESCRIPTION OF THE PREFERRED EMBODIMENT

Figure 1:
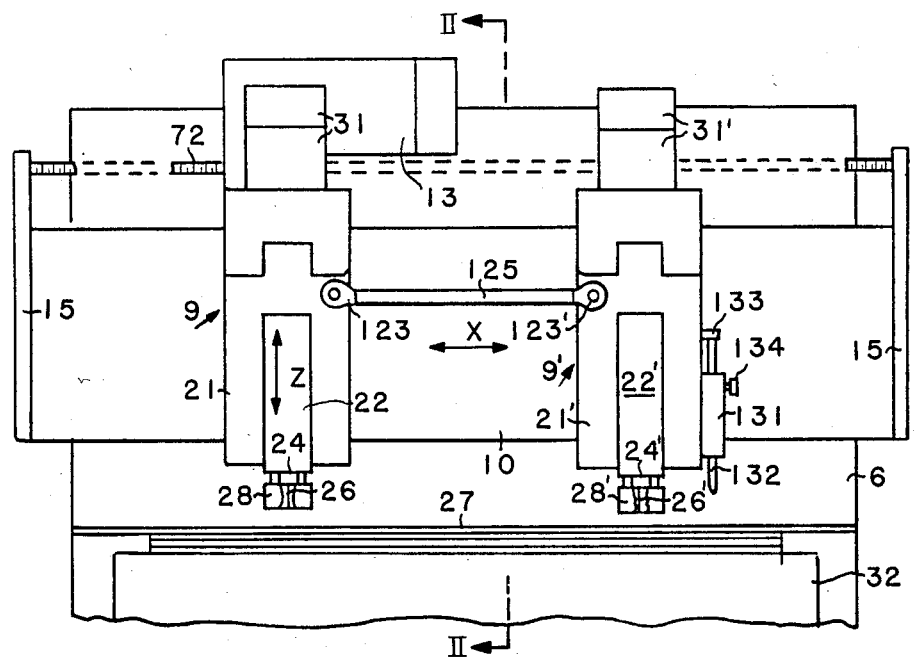
FIG. 1 is a partial sectional front view of a drilling machine for boards of printed circuits, according to the invention.

With reference to FIG. 1, the drilling machine includes a machine frame 6 and a drill operating head 9 for a group of boards 27 of support for printed circuits. The boards 27 are made of epoxy-glass coated with a metallic layer, which will be then photoetched according to the circuit to be manufactured. The drilling is effected in a series of positions to allow the connection between circuit points on the two faces of the board and the insertion of the possible discrete or integrated circuits.

Figure 3:
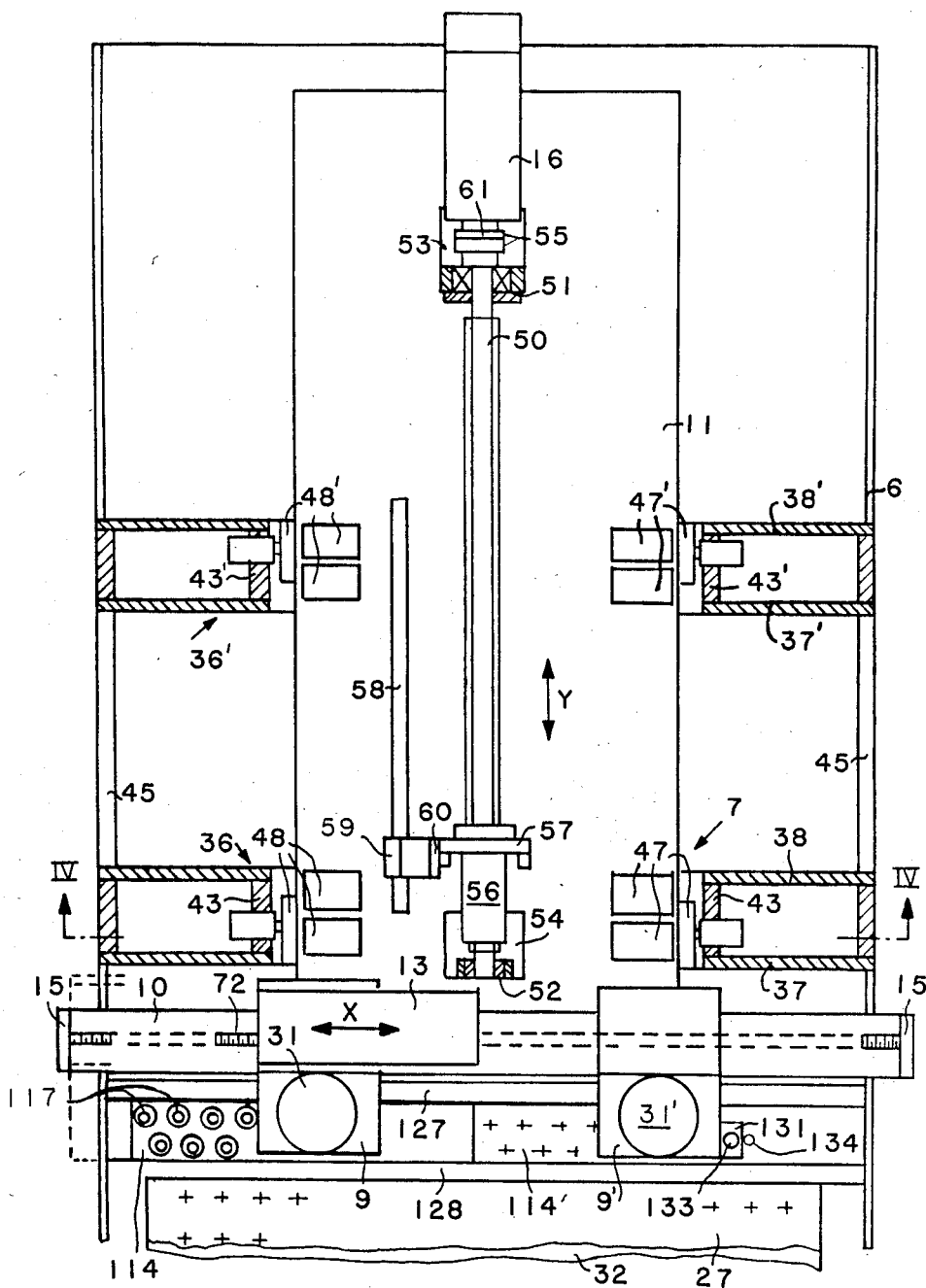
FIG. 3 is a partial sectional plan view of the drilling machine.

The head 9 is provided with a spindle 24 which carries a drilling tool 26 and will be better seen hereinafter. The boards 27 are located in a table 32, which is not movable on the horizontal plane, with respect to the stationary machine frame 6, whereas the head 9 is movable along two coordinate axes conventionally indicated as X and Y (FIG. 3).

Figure 6:
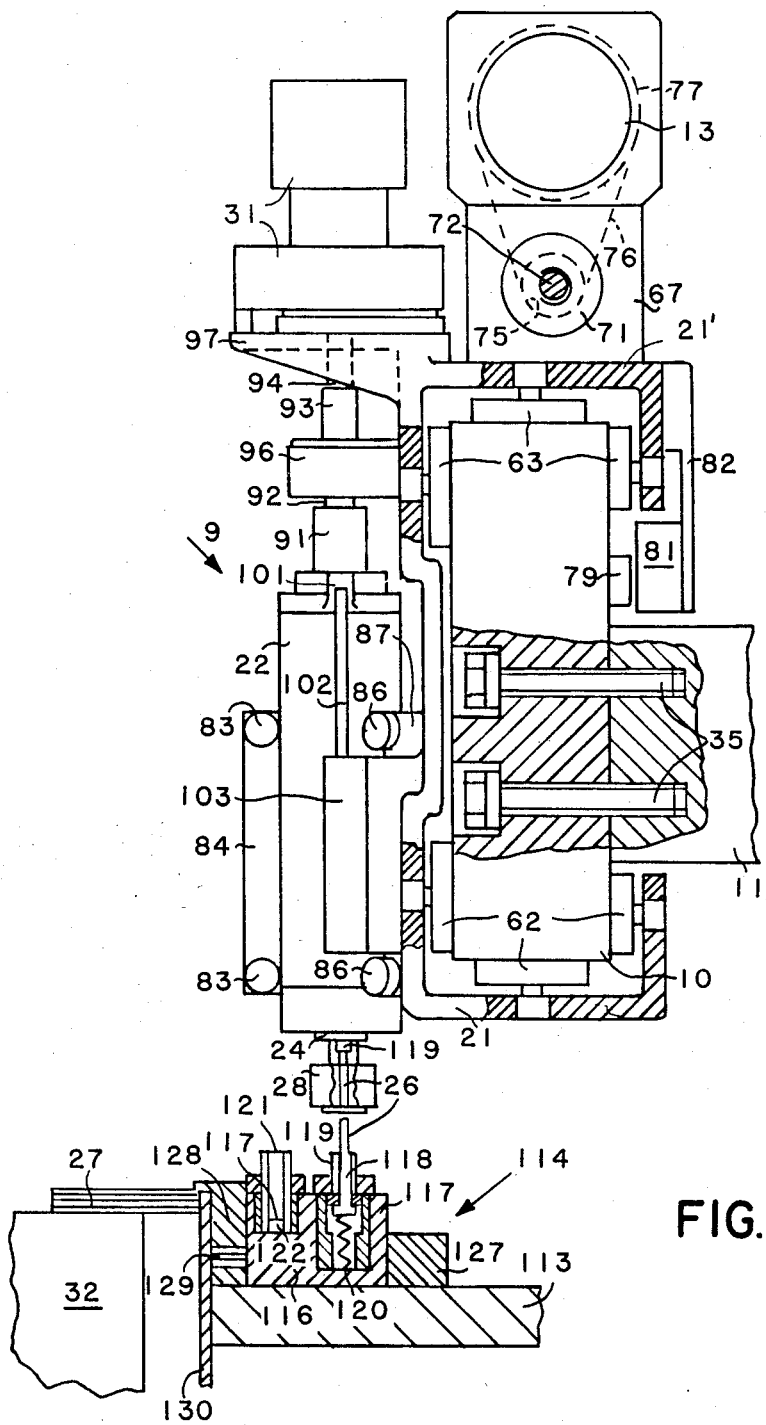
FIG. 6 is a section according to the line VI—VI of FIG. 5.

To this end, the head 9 is carried by a pair of cross slides, generically indicated by 7, which enables it to be moved with respect to the table 32 in any drilling position. These slides comprise a strong transverse bar 10 parallel to the X-axis and secured as a T to a prismatic bar 11 parallel to the Y-axis. The T structure of the bar 10 and the bar 11 is located above the table 32, whereby the head 9 effects the drilling by acting from the top downwards on the boards 27 located on the table 32. In this way the accessibility to the operator of the table for loading and/or the unloading of the boards is increased. In particular, both the bar 10 and the bar 11 are formed of two strong granite blocks of a rectangular section, worked with the highest precision and rigidly mutually secured by means of a series of dowel screws 35 (FIG. 6). The resulting structure 7 is thus very rigid, substantially insensible to the thermal dilatations and deprived of elastic flexings.

Figure 4:
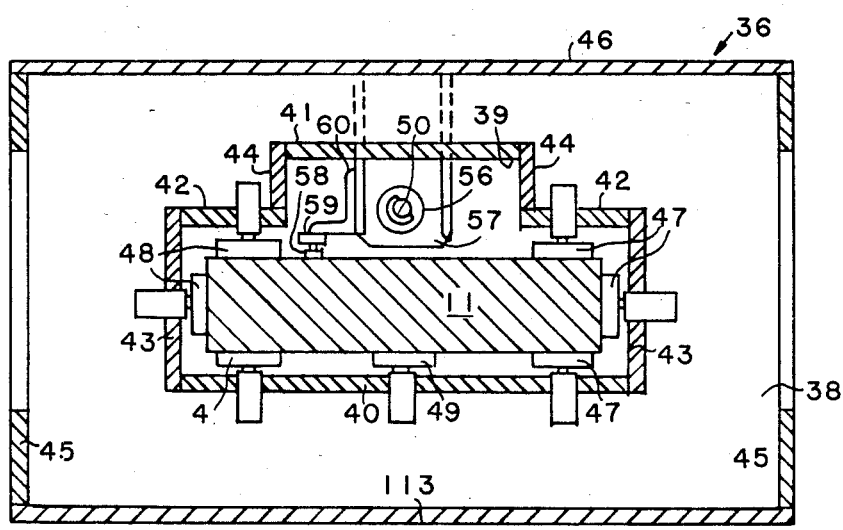
FIG. 4 is a transverse section taken according to the line IV—IV of FIG. 3.

The bar 11 (FIG. 2) is guided into a double portal structure 36, 36', which is part of the frame 6. The two portals are mutually similar, whereby only the portal 36 will be described, whereas in the portal 36' the corresponding parts are indicated with the same reference numbers provided with prime. The portal 36 comprises a pair of transverse plates 37 and 38 having a reverse T aperture 39 (FIG. 4). Into the aperture 39 the two plates 37 and 38 are connected by a set of longitudinal horizontal plates 40, 41, 42 and vertical plates 43 and 44. The two pairs of plates 37, 38 and 37', 38' (FIG. 2) are also connected laterally by two vertical plates 45 and upwards by a cover plate 46.

Mounted on the portal 36 (FIG. 4) are two series of air bearings 47 and 48, each one adapted to guide three faces of the bar 11, and a central air support bearing 49. The bearings 47, 48, 49 and 47', 48', 49' (FIG. 2) define thus the guide for the bar 11 along the Y-axis.

Secured to the backward end of the bar 11 (FIGS. 2 and 3) is a servomotor 16, formed of a direct current electric motor, provided with a tachometer generator for the speed feed back control. The shaft 61 of the motor 16 is connected to an endless screw 50 by means of a front clutch 55 adapted to allow possible small axial displacements between the shaft 61 and the screw 50. This latter is rotatably mounted on two bearings 51 and 52 carried by two corresponding supports 53 and 54 secured to the same bar 11. The screw 50 engages a female screw 56 secured to a vertical plate 57 in turn rigidly connected to the transverse plate 38.

Furthermore, secured to the bar 11 (FIG. 4) is a finely graduated bar 58 adapted to be read by a position transducer 59, formed of an optical prisma reader with offset diodes, known per se. The transducer 59 is secured to a bracket 60 rigidly connected to the plate 57.

Figure 5:
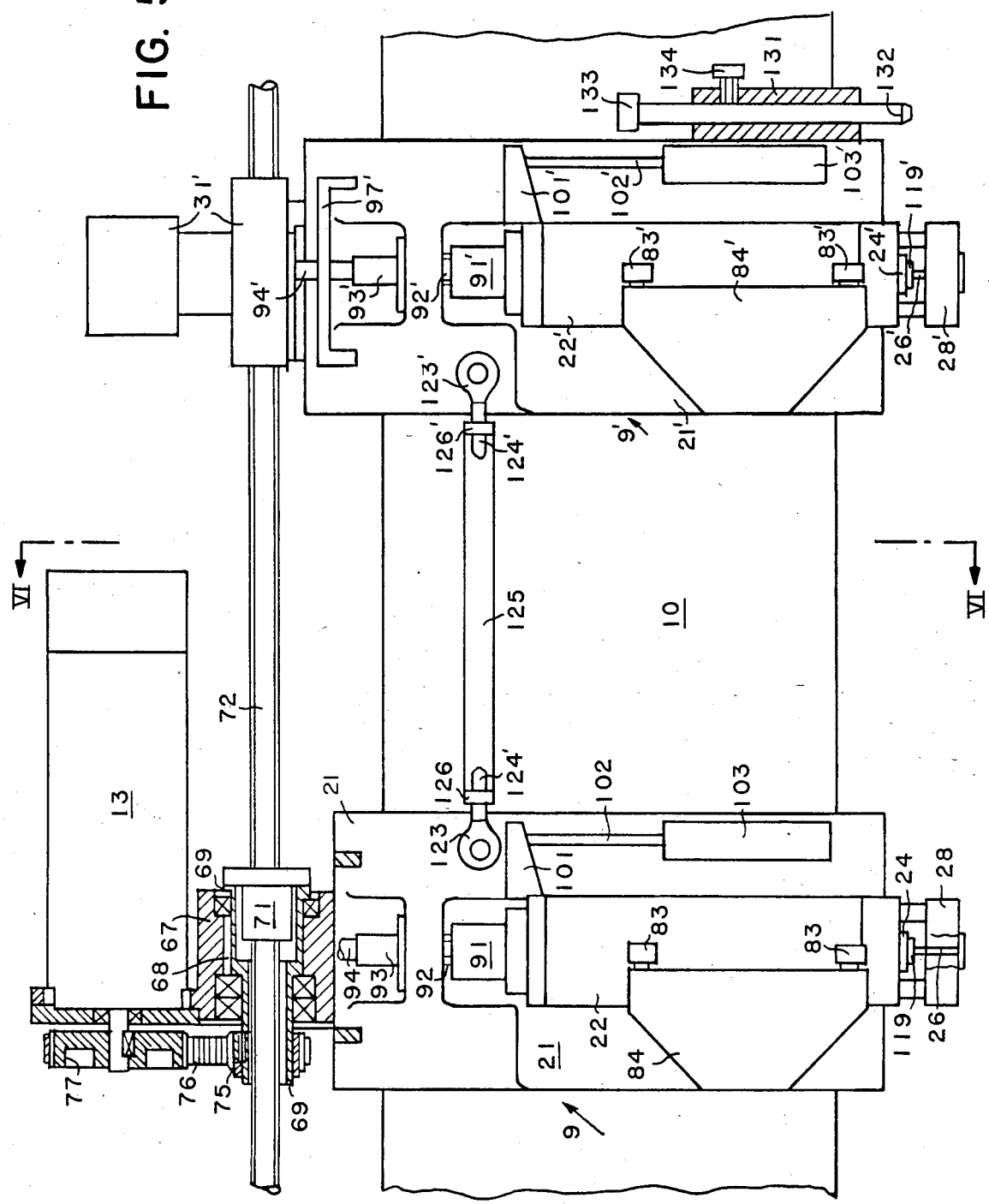
FIG. 5 is a view of a detail of FIG. 1, in an enlarged scale.

The drilling head 9 comprises a carriage 21 (FIG. 6) formed of a C-structure, mounted on which are two other series of air bearings 62 and 63, each one cooperating in three planes with the bar 10. Furthermore, secured to the upper part of the carriage 21 is a prismatic support 67 having a cylindrical hole 68 (FIG. 5). Rotatably mounted in this hole is a sleeve 69, which is secured to a female screw 71 in engagement with an endless screw 72. This latter at the two ends is secured to two plates 15 (FIG. 3) in turn secured to the two end faces of the bar 10.

Furthermore, secured to the sleeve 69 (FIG. 5) is a toothed pulley 75 connected through a toothed belt 76 to a second toothed pulley 77 having a diameter twice that of the pulley 75. The pulley 77 is secured to the shaft of a direct current electric motor 13 provided with a tachometer generator. The motor 13 is secured to the support 67 and forms the servomotor for the X-axis. Finally secured to the backward surface of the bar 10 is another graduated bar 79 (FIG. 6) adapted to be read by another optical position transducer 81 carried by a small plate 82 secured to the carriage 21.

Vertically slidable on the carriage 21 along the Z-axis is a quill 22, which is guided by a pair of forward rollers 83 carried by a support 84 and two pairs of lateral rollers 86, only one of which is visible in FIG. 6, carried by two corresponding supports 87. The support 84 and the two supports 87 are secured to the carriage 21.

Rotatably mounted on the quill 22 is the spindle 24, which is connected to the rotor of an electric motor 23 (FIG. 2), the stator of which is secured to the quill 22. This latters carries also a board pressing device 28, adapted to be operated during the drilling for keeping the boards 27 pressed, and a device for the suction of the debris of the drilling machine.

Furthermore, secured to the quill 22 is a female screw 91 (FIG. 5) cooperating with an endless screw 92 connected through a joint 93 to the shaft 94 of a third direct current electric motor 31, provided also with a tachometer generator and forming the servomotor for the Z-axis. The joint 93 is mounted on a projection 96 of the carriage 21, whereas the motor 31 is secured to a bracket 97 of the carriage 21.

Secured to the upper end of the quill 22 is a projection 101 carrying a rod 102, which cooperates with a linear potentiometer 103 secured to the carriage 21. The potentiometer 103 is thus adapted to indicate the position of the quill 22 along the Z-axis.

The three servomotors 13, 16 and 31 are controlled by a numerical control unit 18 (FIG. 8) known per se, which receives the signals of the transducers 59, 81 and 103 for the position feedback and the signals of the tachometer generators of the same motors.

The unit 18 is controlled by a program unit 19, for example a magnetic tape unit, recorded on which is the program of one or more drilling cycles. The unit 18 is also connected to a command keyboard 20 and to a display screen 25 for example of the cathode ray type. The unit 18 may have provision also for the recording of a new program set up on the keyboard 20.

The unit 18 is also adapted to control the motor 23 of the spindle 24, two electrovalves 109 and 111 for the air bearings 62, 63 of the X-axis (FIG. 6) and 47, 48, 49 and 47', 48' and 49' of the Y-axis (FIG. 4). Finally, the unit 18 (FIG. 8) is adapted to control through an electrovalve 112 a pneumatic device for operating the spindle 24 (FIG. 6) in order to lock and unlock the tool 28 inserted thereinto.

Located on a plate 113 (FIGS. 6 and 7) of the stationary machine frame 6 is a tool magazine, generically indicated by 114, to allow the changing of the tool 26 both in the case of changing of working and in the case of tool breakage, as well as when it is considered worn after a certain number of holes. The magazine 114 is formed of a support 116 secured to the plate 113 of the machine frame 6, and carries a set of nine tool seats, each one formed of a sleeve 117 secured to the support 116.

Vertically slidable in each sleeve 117 is an elastic grip, formed of a bushing 118 provided upwards with vertical notches. The bushing 118 can engage a collar 119, which is provided on each tool 26. Each grip 118 is normally held in raised position by a compression spring 120, which allows for a certain downward stroke, in case the spindle 24 is lowered when is not exactly aligned with the bushing 118.

Figure 8:
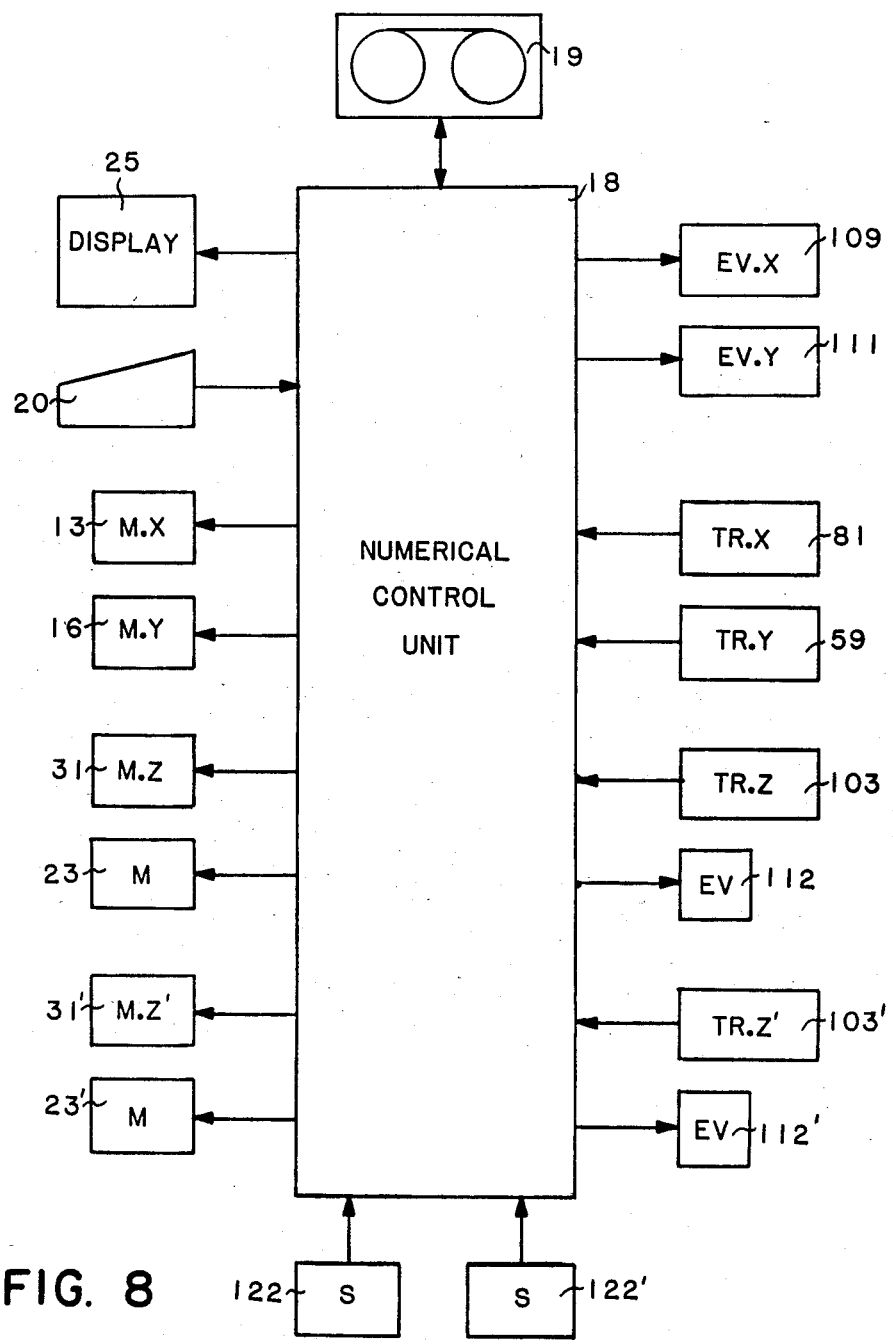
FIG. 8 is a diagram of the control unit of the drilling machine.

Another sleeve 117, seen in FIG. 7 at the right end of the magazine 114, carries a bushing 121, mounted in a manner similar to the grips 118, but of a greater diameter and without the vertical notches. Secured to the bushing 121 is a microswitch 122 adapted to be engaged by the tip of the tool 26, in order to signal possible breakages of the same tool to the control unit 18 (FIG. 8). The nine tools 26 (FIG. 7), which may be located in the grips 118, may all have different diameters, or may be mutually equal in groups. They can be selected by the program recorded in the unit 19 (FIG. 8) according to their position in the magazine 114.

The board drilling machine operates as follows.

At the beginning the head 9 is located at the zero position, dotted in FIG. 3, and allows the loading of the package of boards 27 on the table 32. Operating a key of the keyboard 20 (FIG. 8), puts in operation the control unit 18, which at first through the electrovalves 109 and 111 commands the operation of the air bearings 62, 63, 47, 48, 49 and 47', 48', 49' (FIGS. 2 and 6) of the axes X and Y. Then, in the case that the tool 26 is inserted into the spindle 24, a selection and gripping of the tool 26 command is operated on the keyboard 20 (FIG. 8).

Then the unit 18, through the servomotor 13, causes the carriage 21 (FIG. 6) to slide with the bearings 62, 63 on the bar 10 and through the servomotor 16 (FIG. 2) to cause the bar 11 to slide on the bearing 47, 48, 49 and 47', 48', 49' (FIG. 4). Then the program unit 19 (FIG. 8) controls the unit 18 in a manner to cause at first the positioning of the head 9 in correspondence with the sleeve 117 (FIG. 7) of the magazine 114, where the tool 26 to be selected lies.

Then the program unit 19 (FIG. 8) controls the unit 18 in a manner to command the Z-axis servomotor 31 to lower the quill 22 (FIG. 2) to engage the selected tool 26 with the spindle 24. Now the control unit 18 operates the penumatic device 112 for locking the spindle 24 on tool 26, whereby by returning the quill 22 upwards, the tool 26 is pulled out from the grip 118.

Now the control unit 18 (FIG. 8) displaces the head 9 in a manner so as to bring it in correspondence with the bushing 121, to check whether the tool 26 is whole. Subsequently, by operating a further command of the keyboard 20 (FIG. 8), the control unit 18 is commanded in a manner so as to displace the head 9 (FIG. 3) in sequence to the positions foreseen for the drilling, recorded in the program unit 19, whereby the package of boards 27 is drilled in these positions.

Upon terminating the drilling of the package of boards 27, the head 9 is brought to the zero position, whereby a new drilling cycle can be started.

The checking of the integrity of tool 26 can also be automatically commanded before the starting of a drilling cycle or with less frequency. If in one of these checkings the tool 26 (FIG. 6) fails to engage the microswitch 122, the control unit 18 (FIG. 8) indicates the emergency to the operator through the screen 25 or by means of a pilot light not shown in the drawings. Furthermore, the unit 18 blocks the further execution of the drilling program.

Then the operator, by means of the keyboard, may select a new tool 26 and command a tool changing operation. In this operation the control unit 18 first brings the head 9 over the magazine 114 (FIG. 6) in correspondence with the seat of the tool 26 to be replaced, then it brings the quill 22 to insert the tool 26 into the sleeve 117 and through the penumatic device 112 (FIG. 8) unlocks the spindle 24. Now the grip 118 engages the collar 119 and holds the tool 26. Thereafter the control unit 18 (FIG. 8) brings the head 9 in correspondence with the seat of the new tool, lowers it and, through the electrovalve 112 and the locking device, controls the securing of this tool. The tool changing operation can obviously be controlled by program too, in order to replace a tool 26 considered worn, or when it is necessary to make holes of a different diameter.

A plurality of drilling heads 9, 9', etc. (FIGS. 1, 3, 5) can be mounted on the same bar 10, for the purpose of drilling in parallel a plurality of equal supports of printed circuits. In the drawings only one of these additional heads is shown, the various parts of which are indicated with the same reference number on the head 9, provided with prime. According to the invention, the head 9' comprises a corresponding spindle 24' with a board presser 28' mounted on the quill 22'. This one is carried by a carriage 21' similar to the carriage 21 and is operated by its own servomotor 31' under the control of a corresponding transducer 102', 103'. However the carriage 21' is without the servomotor of the X-axis, whereby the head 9' becomes slave. The movement of the head 9' along the X-axis is controlled by the same motor 13 of the main head 9, by rigidly connecting the two carriages 21 and 21', at a distance equal to the width of a printed circuit. The two supports of printed circuits, can thus be obtained on a single board 27, which then shall be cut after the drilling or the photoetching.

To this end, fulcrumed on the two carriages 21 and 21' (FIG. 5) are two corresponding supports 123, 123' provided with two corresponding pins 124, 124' threaded in opposite direction. Located between the two supports 123, 123' is a pulling rod 125 provided at the two ends with two threaded bushings 126, 126', which engage the threaded pins 124 and 124' in an adjustable manner, whereby the distance between the two heads 9, 9' can be fixed accurately. If one more than two supports of printed circuits are to be obtained from a single board 27, as many drilling heads mutually connected by several pulling rods equal to the pulling rod 125 must be located on the transverse bar 10.

The spindle 24' is provided with a pneumatic device for locking the tool, adapted to be commanded by another electrovalve 112' operable for locking and unlocking the tool 26'. In order to replace the tool 26' also on the spindle 24' of the head 9', located on the plate 113, is another magazine 114' (FIG. 7) of tools 26', associated with the head 9' and comprising a block 116' and a set of sleeves 117' for a second set of tools 26'.

The two supports 116 and 116' are normally secured between two parallel bars 127 and 128 extended through the entire width of the machine. While the support 116 of the magazine 114 is permanently fixed between the two bars 127 and 128 in a predetermined transverse position, the support 116' of the magazine 114' may be secured, in a position to be adjustable according to the distance between the two heads 9, 9' selected each time, by means of two set screws 129, which are screwed into the bar 128 where crossing a vertical plate 130 guiding the boards to be drilled.

Furthermore, secured to the carriage 21' (FIG. 5) of the head 9' is a block 131 carrying a reference rod 132, having a frusto-conical tip and located at a predetermined distance at the right of the axis of the spindle 24'. The rod 132 ends with a manually operable knurled knob 133 and is fixed in the desired axial position by means of a set screw 134. Finally, the magazine 114' (FIG. 7) comprises a hole 135 adapted to house the rod 132 and located at a distance from the first leftward sleeve 117' of the magazine 114' equal to said prefixed distance.

After having fixed the two heads 9, 9' at the desired distance by means of the pulling rod 125, by a command the spindle 24 is caused to keep the tool 26 of the first grip 118 of the magazine 114, while the spindle 24' of the head 9' remains without a tool in the raised position. Then the support 116' of the magazine 114' is released from the bar 128 by unscrewing the screws 129. The magazine 114' is then manually displaced along the bars 127 and 128 so as to bring the hole 135 substantially aligned with the rod 132. Now the rod 132 is released from the screw 134, and through the knob 133, the rod 132 is displaced downwards. Now the frusto-conical end of the rod 132 engages within the hole 135 and exactly aligns with this latter, whereby the support 116' of the magazine 114' is exactly positioned at the distance from the support 116 of the magazine 114 prefixed for the two heads 9 and 9'. Finally, the two screws 129 are rescrewed, thus also rigidly securing the magazine 114' to the two bars 127 and 128, while the rod 132 is returned to the inactive raised position where it is locked through the screw 134. Therefore, now the tool changing and its integrity checking operations can be controlled simultaneously for both heads 9 and 9'.

It is intended that various modifications and improvements can be made to the drilling machine according to the invention without departing from the scope of the invention. For example, one or both granite blocks 10 and 11 may be replaced by metallic guides. Furthermore, the bearings along the axes X and/or Y may be of a type different than the air bearings, while the second head 9' may be controllable by its own servomotor also along the X-axis. In turn the two servomotors 31 and 31' may be feed-back controlled by a single transducer 103, to move the two heads 9, 9' synchronously along the Z-axis. Finally, for altering the distance between the two heads 9, 9' and/or the two magazines 114 and 114', automatic displacing devices may be provided, controllable through the control unit 18.

What I claim is:

1. A drilling machine for drilling boards, particularly printed circuit boards, comprising
   a stationary frame,
   a horizontal board supporting table carried by said frame,
   at least one drilling head movable vertically for drilling the boards supported by said table,
   a pair of cross slide means movably mounting said head with respect to said frame along a pair of horizontal coordinate axes, and
   displacing means for displacing said head along said slide means to reach any drill position over said table, wherein
   one slide means of said pair is formed of a longitudinal prismatic bar slidably mounted on said frame to be moved by said displacing means along a first one of said coordinate axes with respect to said frame, the other slide means of said pair being formed of a transverse prismatic bar slidably mounting said head for movement by said displacing means along the other of said coordinate axes with respect to said transverse bar,
   said transverse bar being permanently secured to one end of said longitudinal bar as to form therewith a rigid T-shaped structure,
whereby said head is displaced by said displacing means along said first coordinate axis bodily with said T-shaped structure.

2. A drilling machine as in claim 1, wherein said transverse bar and said longitudinal bar are formed of two granite blocks, said blocks having each one a rectangular section, and including two air bearing systems associated respectively with said head and with said frame and cooperating with said blocks, and at least two groups of air bearings of each of said systems being associated to each of said blocks, each group engaging three faces of the corresponding block.

3. A drilling machine as in claim 2, wherein the displacing means includes a pair of servomotors controlled by a numerical control apparatus, and a pair of linear position transducers associated with said servomotors for feed back controlling the position reached by said head along said axes, each one of said transducers including a graduated rod secured to the corresponding block and an optical prisma reader provided with off-set diodes.

4. A drilling machine as in claim 3, wherein one of said servomotors rotatively operates a female screw mounted on said head, an endless screw secured to said transverse bar engaging said female screw, the other servomotor being mounted on said longitudinal bar and rotatively operating another female screw secured to said frame, another endless screw mounted on said longitudinal bar engaging said other female screw.

5. A drilling machine as in claim 1, including at least another drilling head slidably mounted on said transverse bar, connecting means for rigidly mutually connecting said heads, whereby at least two adjacent printed circuits can be simultaneously drilled, said connecting means including an elongated rod, and means for adjusting the length of said rod according to the required distance between said two heads, whereby the holes of two equal printed circuits can be drilled on two different zones of a common board.

6. A drilling machine for drilling printed circuit boards, comprising
   a stationary frame, a horizontal board supporting table carried by said frame,
   a first drilling head movable vertically for drilling said boards,
   a pair of cross slide means movably mounting said head with respect to said frame along a pair of horizontal coordinate axes, said cross slide means including a prismatic bar slidably guiding said head along a first one of said coordinate axes, and displacing means for displacing said head along said bar and for displacing said bar along the other of said coordinate axes to cause said head to reach any drill position over said boards, wherein the improvement includes
   a second drilling head slidably mounted on said bar,
   means for mounting a pair of boards to be drilled mutually adjacent on said table at a predetermined distance parallel to said bar,
   an elongated rod rigidly mutually connecting said heads,
   means for adjusting the length of said rod according to said distance,
   each one of said heads including a spindle for engaging a drilling tool and operating means for opening and closing the spindle to automatically change the relevant tool,
   said machine also including a pair of similar magazines of tools, each one associated with one of said heads, and means for adjustably mounting said magazines on said frame parallel to said bar at a mutual distance corresponding to said distance.

7. A drilling machine as in claim 6, wherein said means for adjustably mounting said magazines includes
   a reference rod mounted on said second head so as to be movable vertically toward said table,
   a reference hole provided on the magazine associated with said second head for housing said reference rod when moved vertically, and
   means operable for fixing said second magazine to said frame upon insertion of said rod into said reference hole.

8. A drilling machine as in claim 6, including a pair of tool integrity sensing members, a pair of seats each one mounted on one of said magazines for housing said members, said heads being displaced simultaneously in correspondence with said seats for causing the relevant tools to engage said sensing members.

* * * * *

UNITED STATES PATENT AND TRADEMARK OFFICE
CERTIFICATE OF CORRECTION

PATENT NO. : 4,596,067
DATED : June 24, 1986
INVENTOR(S) : Angelo Raiteri

It is certified that error appears in the above–identified patent and that said Letters Patent are hereby corrected as shown below:

Column 4, line 10, "tool 28" should be --tool 26--.

Signed and Sealed this

Seventh Day of October, 1986

[SEAL]

Attest:

DONALD J. QUIGG

Attesting Officer

Commissioner of Patents and Trademarks